United States Patent
Peugh et al.

[19]

[11] Patent Number: 6,156,980
[45] Date of Patent: Dec. 5, 2000

[54] FLIP CHIP ON CIRCUIT BOARD WITH ENHANCED HEAT DISSIPATION AND METHOD THEREFOR

[75] Inventors: Darrel Eugene Peugh; Joanna Christine Berndt; Bruce Alan Myers, all of Kokomo, Ind.

[73] Assignee: Delco Electronics Corp., Kokomo, Ind.

[21] Appl. No.: 09/090,495

[22] Filed: Jun. 4, 1998

[51] Int. Cl.[7] ........................................ H05K 1/00
[52] U.S. Cl. .................... 174/252; 174/260; 174/262; 361/719
[58] Field of Search ...................... 174/261, 252, 174/260, 263, 262; 361/768, 719; 438/108; 257/737, 778, 779; 291/739

[56] References Cited

U.S. PATENT DOCUMENTS

| | | | |
|---|---|---|---|
| 5,352,926 | 10/1994 | Andrews | 257/717 |
| 5,710,071 | 1/1998 | Beddingford et al. | 438/108 |
| 5,777,386 | 7/1998 | Higashi et al. | 257/737 |
| 5,969,461 | 6/1999 | Aderson et al. | 310/313 |
| 5,973,927 | 10/1999 | Tanaka | 361/760 |

*Primary Examiner*—Jeffrey Gaffin
*Assistant Examiner*—Kamand Cuneo
*Attorney, Agent, or Firm*—Jimmy L. Funke

[57] ABSTRACT

A circuit structure and method for conducting heat from a power flip chip. Heat is dissipated from a flip chip mounted to a PCB by conducting heat through conductive vias to the opposite surface of the PCB. The flip chip is equipped with two sets of solder bumps, one of which is registered with conductors on the PCB, while the second is registered with a thermal conductor layer on the PCB surface and electrically isolated from the conductors. A second thermal conductor layer on the opposite surface of the PCB contacts the vials, such that heat is conducted from the flip chip to the second thermal conductor layer through the second set of solder bumps, the first thermal conductor layer, and the conductive vias. A heatsink is embedded in the PCB between the vias and the second thermal conductor layer to further promote heat conduction away from the flip chip. Heat can be conducted from the PCB with a second heatsink, such as a housing that encloses the PCB. The second heatsink either directly contacts the second thermal conductor layer, or makes thermal contact with the second thermal conductor layer through a thermally-conductive lubricant or adhesive.

20 Claims, 1 Drawing Sheet

FLIP CHIP ON CIRCUIT BOARD WITH ENHANCED HEAT DISSIPATION AND METHOD THEREFOR

FILED OF THE INVENTION

The present invention generally relates to power semiconductor devices. More particularly, this invention relates to a method and circuit board structure for conducting and dissipating heat from a power flip chip for purposes of thermal management of such devices.

BACKGROUND OF THE INVENTION

A variety of approaches are known for dissipating heat generated by power semiconductor devices. One such method entails the use of a ceramic substrate, such as alumina ($Al_2O_3$) or another ceramic material that may be modified to promote its heat conduction capability. Heat-generating integrated circuit (IC) chips, such as power flip chips, are often mounted to alumina substrates that conduct and dissipate heat in the vertical direction away from the chip. These designs are limited in their ability to dissipate heat laterally because the thermal conductivity of ceramic materials is low compared to metals and metal-containing materials, though relatively high compared to printed circuit boards (PCBs). Therefore, thick-film conductors are often used with power IC components on alumina substrates to promote lateral heat conduction away from the component. The typical thermal performance for power IC flip chips mounted in this manner is about 6 to 12_C rise per Watt of power dissipated. Disadvantages with ceramic substrates include the relatively higher cost of the substrate, and ceramic materials do not lend themselves to the use of leaded or through-hole mounted components such as relays, large diodes and transistors. In addition, components generally cannot be mounted to both sides of a ceramic substrate.

Another known method for thermal management of a power flip chip is to use a flex circuit laminated or bonded to heatsink formed by an aluminum sheet or layer having a typical thickness of about 0.05 inch (about 1.25 mm). If the flex circuit material is sufficiently thin, e.g., less than about 0.25 mm, this approach can employ a highly conductive path formed by copper-plated via holes through the flex circuit to the aluminum heatsink. The typical thermal performance for power IC flip chips mounted on flex circuits in this manner is about 3 to 12_C/Watt power dissipated. However, the entire rigid section of the circuit must be backed with aluminum, which makes it difficult to mount leaded parts and prevents components from being mounted to the side of the substrate with the heatsink.

Yet another method for dissipating heat from a power IC is to package the device and mount it to a heat rail on a PCB. Typical thermal performance for power IC's mounted in this manner is about 2 to 4_C/Watt power dissipated. However, the packages and heat rails are relatively large in size, and heat rails must generally be specially fabricated to mount IC packages. Power packages with more than fifteen pins and that can be mounted to a heat rail are generally not available or are very expensive.

Finally, PCBs have been equipped with innerlayer heatsinks that are the same size or are larger than the PCB to provide a large heatsink for the entire board, and rely on conduction through the PCB material to the heatsink beneath. However, this thermal management approach is relatively costly, has not been used with PCBs carrying flip chips, and is not compatible with small electrical vias, resulting in reduced wiring density.

From the above, it can be seen that the various current approaches to thermal managing power IC's have drawbacks that limit their application, incur significant additional costs, and/or impose undesirable restrictions on circuit layout and design. Therefore, it would be desirable if a circuit construction were available that provided improved thermal management for power ICs, and particularly power flip chips. Such a structure would preferably permit the use of power flip chips of minimal size, enable thermal enhancement of localized areas of the circuit substrate for lower cost and greater design flexibility, be compatible with leaded components, and permit mounting of components on both sides of the circuit substrate.

SUMMARY OF THE INVENTION

It is an object of this invention to provide a circuit structure and method for conducting heat from a power flip chip. According to the present invention, heat is dissipated from a flip chip mounted to a PCB by conducting heat through conductive vias to the opposite surface of the PCB. Also in accordance with this invention, the flip chip has two sets of solder bumps, one set of which is registered with conductors on the PCB, while the second set is registered with a thermal conductor layer on the PCB surface and electrically isolated from the conductors. A second thermal conductor layer on the opposite surface of the PCB contacts the vias, such that heat is conducted from the flip chip to the second thermal conductor layer through the second set of solder bumps, the first thermal conductor layer, and the conductive vias. Preferably, a heatsink is embedded in the PCB between the vias and the second thermal conductor layer to further promote heat conduction away from the flip chip.

In a preferred embodiment, heat is conducted from the PCB with a second heatsink, such as a housing that encloses the PCB. The second heatsink either directly contacts the second thermal conductor layer, or makes thermal contact with the second thermal conductor layer through a thermally-conductive lubricant or adhesive. The lubricant/adhesive advantageously serves to fill gaps between the second thermal conductor layer and the second heatsink in order to promote thermal contact. An additional advantage of thermally-conductive lubricants and compliant adhesives is that they also serve to decouple any lateral mechanical strains that may arise as a result of different thermal expansions and movement between the PCB and housing.

From the above, one can see that the circuit structure of this invention provides an uncomplicated and efficient method for dissipating heat from a power flip chip. Instead of relying on heat conduction solely through the PCB substrate, or lateral heat conduction through thick-film conductors, aluminum backings and heatrails as previously done, the present invention conducts heat away from the chip through thermal-conducting solder bumps that transfer heat through the PCB along a limited and highly-conductive path formed by the first and second thermal conductor layers, thermal vias and preferably an embedded heatsink. From the second thermal conductor layer, heat can be transferred to a second heatsink that needs only thermally contact the second thermal conductor layer, and therefore is not required to contact the entire lower surface of the PCB substrate. The result is a relatively low-cost circuit structure that provides localized heat conductive paths to those regions of a PCB that particularly require thermal management. In addition, the ability to provide thermal enhancement of localized areas of a circuit board permits mounting of components to the lower surface of the board outside the enhanced areas, which in turn allows the board size to be reduced.

Other objects and advantages of this invention will be better appreciated from the following detailed description.

BRIEF DESCRIPTION OF THE DRAWINGS

The present invention will now be described, by way of example, with reference to the accompanying Figures, in which.

DETAILED DESCRIPTION OF THE INVENTION

Figure 1:
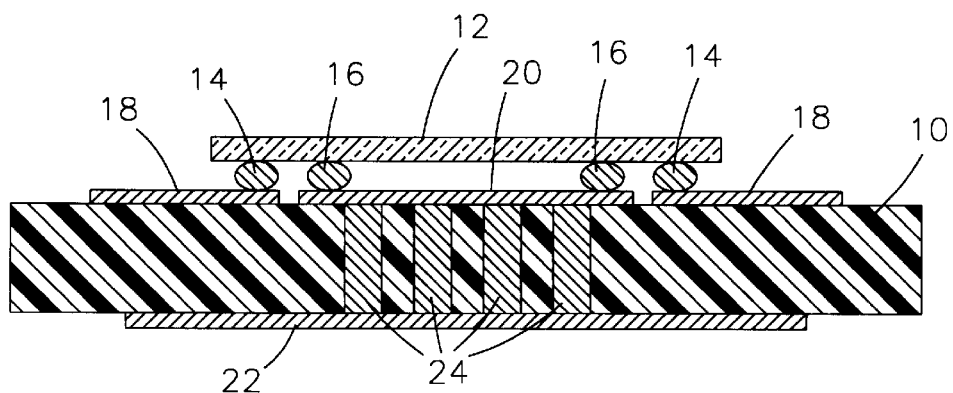
FIGS. 1 and 2 show power flip chips mounted to PCBs in accordance with two embodiments of this invention.

FIG. 1 shows a power flip chip 12 mounted to a PCB 10 of any suitable material and construction. A typical thickness for the PCB 10 is within a range of about 0.031 to about 0.062 inch (about 0.8 to about 1.6 millimeters). As shown, the flip chip 12 is mounted to the PCB 10 two sets of solder bumps 14 and 16. As shown, the solder bumps 14 are located near the perimeter of the chip 12, while the remaining solder bumps 16 are generally located within the interior of the chip surface. The solder bumps 14 serve to electrically connect the flip chip microcircuitry (not shown) to appropriate circuitry on the PCB 10. In accordance with conventional practice, the solder bumps 14 and 16 permit mounting of the flip chip 12 using a technique in which the solder bumps 14 and 16 are preformed on the front side of the chip 12 (the surface of the chip 12 on which the flip chip microcircuitry is formed). The solder bumps 14 are then registered with and reflow soldered to conductors 18 on the surface of the PCB 10 to yield solder connections as shown in FIG. 1.

According to the invention, the second set of solder bumps 16 are not required for electrical connection, but instead are dedicated to conducting heat away from the chip 12. For this purpose, a layer of thermally-conductive material, termed here a thermal plane 20, lies on the surface of the PCB 10 and is surrounded by a conductor pattern defined by the conductors 18. The thermal plane 20 lies directly beneath the solder bumps 16, which are reflow soldered to the thermal plane 20 during the same cycle in which the solder bumps 14 are reflow soldered to their respective conductors 18. Suitable materials for the thermal plane 20 include those used to form the conductors 18, e.g., copper and its alloys, permitting the thermal plane 20 to be formed simultaneously with the conductors 18.

FIG. 1 shows the PCB 10 as further including a second thermal plane 22 that is thermally connected to the first thermal plane 20 with a number of thermal vias 24. The thermal vias 24 are preferably plated through-holes, in which holes having a diameter of about 0.008 to about 0.013 inch (about 0.2 to about 0.33 mm) are formed through the substrate and then plated with copper or another suitable metal prior to forming of the thermal planes 20 and 22. It is foreseeable that other methods could be used to form the thermal vias 24, such as filling through-holes with a conductive paste. With the structure shown in FIG. 1, heat from the chip 12 is conducted through the solder bumps 16 to the thermal plane 20, through the PCB 10 with the thermal vias 24, and then into the thermal plane 22. Notably, the thermal plane 22 does not occupy a large area on the surface of the PCB 10 opposite the flip chip 12, permitting components to be mounted on both sides of the PCB 10.

Those skilled in the art will appreciate that the solder bumps 16 may be electrically active if they all carry the same signal and the thermal plane 22 also serves as an electrical conductor on the PCB 10, e.g., the thermal plane 22 is electrically connected to components on the bottom side of the PCB 10. Otherwise, the solder bumps 16 are devoted exclusively to transferring heat from the chip 12, which can then further entail transferring heat from the PCB 10 through the thermal plane 22 to a structure with which the PCB 10 is supported, as shown in FIG. 2.

The process for forming the structure shown in FIG. 1 generally involves forming through-holes in the PCB 10, and then plating copper on the walls of the through-holes to yield the thermal vias 24 shown. This process entails conventional PCB fabrication techniques and processes, and can be performed simultaneously with the forming and plating of electrically-active through-holes in the PCB 10. The conductors 18 and thermal planes 20 and 22 are then formed by known methods, such as by plating and etching copper. As noted above, the conductors 18 are preferably deposited to define a conductor pattern that surrounds the thermal plane 20. Prior to mounting to the PCB 10, the solder bumps 14 and 16 are formed on the flip chip 12 by any suitable method, with the solder bumps 16 being located within an interior surface region of the chip 12, i.e., surrounded by the solder bumps 14 located near the perimeter of the chip 12. The chip 12 is then mounted to the PCB 10 such that the solder bumps 14 register with the conductors 18 and the solder bumps 16 register with the thermal plane 20. Known reflow methods can then be employed to attach the chip 12 to the PCB 10.

Figure 2:
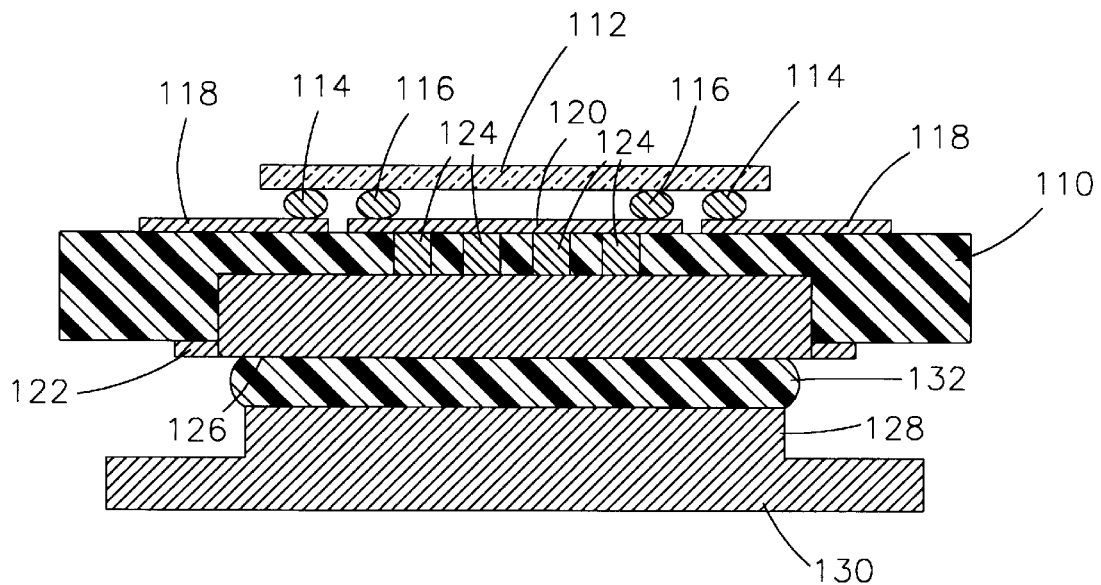

FIG. 2 is an alternative and preferred embodiment of this invention, in which a PCB 110 is modified to include an embedded heatsink 126. As with FIG. 1, a flip chip 112 is shown as being mounted on the PCB 110 with solder bumps 114 and 116, the former electrically connecting the chip 112 to conductors 118 and the latter making thermal contact with a thermal plane 120 on the surface of the PCB 110. Thermal vias 124 conduct heat from the thermal plane 120 to the embedded heatsink 126, over which a second thermal plane 122 lies. Preferred materials for the heatsink 126 include copper and its alloys. In the preferred embodiment, the PCB 110 has a laminate construction, with the heatsink 126 being a "coin" or other metal mass that is placed within the laminate structure, as understood from FIG. 2. As a relatively large thermal mass, the heatsink 126 enhances heat transfer from the chip 112 by providing thermal capacitance as well as distributing heat over a relatively large area toward the thermal plane 124. The heatsink 126 also reduces the length of the thermal vias 124, which are less thermally conductive than the solid copper heatsink 126. Importantly, the thermal plane 122 does not occupy a large area on the surface of the PCB 110 opposite the flip chip 112, permitting components to be mounted on both sides of the PCB 110.

Also shown in FIG. 2, heat can be transferred from the PCB 110 to a structure in which the PCB 110 is mounted or housed. The structure shown in FIG. 2 comprises a pedestal 128 on a metal casing 130, with the intent that the pedestal 128 directly contacts the thermal plane 122 or, as shown in FIG. 2, thermally contacts the thermal plane 122 with a thermally conductive lubricant or adhesive 132 that serves as an interface between the PCB 110 and the casing 130. Use of a thermally-conductive lubricant 132 provides the additional advantage of decoupling any lateral mechanical strains that may arise as a result of different thermal expansions and movement between the PCB 110 and casing 130. Various lubricants and adhesives are known for this purpose, with a suitable lubricant being a silicone grease available from Dow Chemical.

The process for forming the structure shown in FIG. 2 is similar to that described for the embodiment of FIG. 1, with the additional requirement of forming the heatsink 126 within the PCB 110 between the vias 124 and the thermal plane 122. A suitable method is to form the PCB 110 as a laminate structure, with the heatsink 126 being a discrete metal disc or other suitable form that is placed in a recess or opening formed in the layer forming the lower surface of the structure. After forming the conductors 118 and thermal planes 120 and 122, the PCB 110 is positioned within the casing 130 so that the thermal plane 122 either contacts the pedestal 128 directly or, as shown in FIG. 2, thermally contacts the pedestal 128 through the thermal-conducting lubricant or adhesive 132.

While our invention has been described in terms of a preferred embodiment, it is apparent that other forms could be adopted by one skilled in the art. For example, while the invention has been particularly described in reference to use with power flip chips, the invention is also applicable to a variety of surface-mounted components, including IC packages and chip-and-wire ICs. Accordingly, the scope of our invention is to be limited only by the following claims.

What is claimed is:

1. A circuit board assembly comprising:
    a substrate having electrical conductors and a first thermal conductor layer on a first surface thereof and having a second thermal conductor layer on a second surface opposite the first surface;
    a surface-mount IC device mounted to the first surface of the substrate, the surface-mount IC device having a first set of solder bumps registered with the electrical conductors and at least one solder bump registered with the first thermal conductor layer;
    a via within the substrate between the first surface of the substrate and the second surface of the substrate;
    a heat-conductive material within the via and contacting the first thermal conductor layer on the first surface of the substrate; and
    a heatsink embedded within the substrate between the via and the second thermal conductor layer and contacting the heat-conductive material within the via, wherein heat is conducted from the surface-mount IC device to the second thermal conductor layer through the at least one solder bump, the first thermal conductor layer, the heat-conductive material within the via, and the heatsink.

2. A circuit board assembly as recited in claim 1, wherein the substrate is a printed circuit board.

3. A circuit board assembly as recited in claim 1, wherein a plurality of vias are present in the substrate, each of the vias having the heat-conductive material therein and contacting the first thermal conductor layer and the heatsink.

4. A circuit board assembly as recited in claim 1, wherein the substrate has a laminate construction and the heatsink is a metal mass placed within the laminate construction.

5. A circuit board assembly as recited in claim 1, further comprising a housing member contacting the second thermal conductor layer.

6. A circuit board assembly as recited in claim 5, further comprising a thermally-conductive lubricant between the housing member and the second thermal conductor layer.

7. A circuit board assembly as recited in claim 5, further comprising a pedestal on the housing member and thermally contacting the second thermal conductor layer.

8. A circuit board assembly comprising:
    a printed circuit board having electrical conductors and a first thermal conductor layer on a first surface thereof and having a second thermal conductor layer on a second surface opposite the first surface, the electrical conductors defining a conductor pattern that surrounds the first thermal conductor layer on the first surface of the printed circuit board;
    a flip chip mounted to the printed circuit board, the flip chip having a first set of solder bumps registered with the electrical conductors and a second set of solder bumps registered with the first thermal conductor layer, the second set of solder bumps being located on the flip chip at an interior surface region thereof;
    vias within the printed circuit board between the first surface of the printed circuit board and the second surface of the printed circuit board;
    a heat-conductive material plated within the vias and contacting the first thermal conductor layer on the first surface of the printed circuit board; and
    a heatsink embedded within the printed circuit board between the vias and the second thermal conductor layer and contacting the heat-conductive material within the vias, wherein heat is conducted from the flip chip to the second thermal conductor layer through the second set of solder bumps, the first thermal conductor layer, the heat-conductive material within the vias, and the heatsink.

9. A circuit board assembly as recited in claim 8, wherein the printed circuit board has a laminate construction and the heatsink is a metal mass placed within the laminate construction.

10. A circuit board assembly as recited in claim 8, further comprising a housing member contacting the second thermal conductor layer.

11. A circuit board assembly as recited in claim 10, further comprising a thermally-conductive lubricant between the housing member and the second thermal conductor layer.

12. A circuit board assembly as recited in claim 10, further comprising a pedestal on the housing member and thermally contacting the second thermal conductor layer.

13. A method for forming circuit board assembly, the method comprising the steps of:
    providing a substrate having oppositely-disposed first and second surfaces, a heatsink embedded within the second surface, and a via within the substrate between the first and second surfaces;
    depositing a heat-conductive material within the via and forming electrical conductors and a first thermal conductor layer on the first surface of the substrate, the heat-conductive material contacting the first thermal conductor layer and the heatsink;
    forming a second thermal conductor layer on the second surface of the substrate, the second thermal conductor layer contacting the heatsink such that said heat sink is between the via and said second thermal conductor layer; and
    mounting a flip chip to the substrate, the flip chip having a first set of solder bumps registered with the electrical conductors and at least one solder bump registered with the first thermal conductor layer, wherein heat is conducted from the flip chip to the second thermal conductor layer through the at least one solder bump, the first thermal conductor layer, the heat-conductive material within the via, and the heatsink.

14. A method as recited in claim 13, wherein the substrate is a printed circuit board.

15. A method as recited in claim 13, wherein a plurality of vias are formed in the substrate, each of the vias having the heat-conductive material therein and contacting the first thermal conductor layer and the heatsink.

16. A method as recited in claim 13, wherein the substrate has a laminate construction and the heatsink is a metal mass placed within the laminate construction.

17. A method as recited in claim 13, further comprising the step of contacting the second thermal conductor layer with a housing member.

18. A method as recited in claim 17, further comprising the step of placing a thermally-conductive lubricant between the housing member and the second thermal conductor layer.

19. A method as recited in claim 17, further comprising the step of forming a pedestal on the housing member so that the pedestal thermally contacts the second thermal conductor layer.

20. A method as recited in claim 13, wherein the electrical conductors are deposited to define a conductor pattern that surrounds the first thermal conductor layer on the first surface of the printed circuit board, and wherein the second set of solder bumps are located on the flip chip at an interior surface region thereof.

* * * * *